United States Patent [19]
Hoshi

[11] Patent Number: 5,881,070
[45] Date of Patent: Mar. 9, 1999

[54] VARIABLE LENGTH CODING APPARATUS

[75] Inventor: Nobuhiro Hoshi, Yokohama, Japan

[73] Assignee: Canon Kabushiki Kaisha, Tokyo, Japan

[21] Appl. No.: 70,179

[22] Filed: Jun. 2, 1993

[30] Foreign Application Priority Data

Jun. 9, 1992 [JP] Japan .................................. 4-149381

[51] Int. Cl.6 .................................................. H03M 13/00
[52] U.S. Cl. ........................ 371/37.01; 358/431; 375/253
[58] Field of Search ........................ 371/37.01; 341/67, 341/63, 64, 65; 358/261.1; 348/431; 375/253

[56] References Cited

U.S. PATENT DOCUMENTS

| | | |
|---|---|---|
| 5,175,631 | 12/1992 | Juri et al. .................................. 358/335 |
| 5,218,622 | 6/1993 | Fazel et al. ............................. 371/37.1 |
| 5,235,618 | 8/1993 | Sakai et al. .............................. 375/253 |
| 5,302,949 | 4/1994 | Yoshinari et al. ........................ 341/67 |
| 5,321,562 | 6/1994 | Hamada et al. ........................... 360/48 |
| 5,329,375 | 7/1994 | Juri et al. ................................ 358/343 |

*Primary Examiner*—Emmanuel L. Moise
*Attorney, Agent, or Firm*—Fitzpatrick, Cella, Harper & Scinto

[57] ABSTRACT

There is provided a coding apparatus which comprises a coding section for variable-length coding an input signal on a predetermined unit basis, an output section for outputting the data which was variable-length coded by the coding section on the predetermined unit basis, and an error correction adding section for adding an error correction code to the coded data outputted from the output section.

14 Claims, 3 Drawing Sheets

VARIABLE LENGTH CODING APPARATUS

BACKGROUND OF THE INVENTION

1. Field of the Invention

The present invention relates to a data transmitting apparatus and, more particularly, to a transmitting apparatus which transmits variable-length code data.

2. Related Background Art

In a digital data transmitting apparatus, an error detection correction code, a sync block (SYNC), and identification data (ID) are added to data to be transmitted, the resultant data is divided into error correction blocks (or sync blocks) containing a predetermined data amount and is transmitted to a transmitting medium.

There is also a case where data to be transmitted is previously compressed and coded and is subsequently divided into sync blocks.

For example, in a conventional apparatus of a digital video tape recorder (VTR), image data to be recorded is compressed by a fixed-length coding method by a subsampling and/or a DPCM (Differential PCM) coding or the like, error detection correction codes $C_1$ and $C_2$ by product codes are added to the image data of one image plane, and the image data is divided into error correction blocks and recorded onto a magnetic tape.

FIG. 1 shows a fundamental structure of the error correction block. According to the fixed-length coding method, a compression ratio of 1/2 to 1/4 is obtained.

As compared with the fixed-length coding method, according to a variable-length coding method using a run length code or a Huffman code, a high compression ratio of about 1/10 to 1/50 is obtained, so that much attention has been paid to the variable-length coding method for use in transmission of a moving image.

There is, however, a possibility such that when variable-length coding data is sequentially inserted into the data portion of the error correction block, the integrated variable-length coding data will lie in two error correction blocks.

And in the variable-length coding method, there is a case where if the preceding variable-length code cannot correctly be decoded, errors are propagated. In such a case, an image quality is extremely deteriorated.

SUMMARY OF THE INVENTION

It is an object of the present invention to provide a coding apparatus which can solve the above problems and can prevent signal deterioration under such circumstances as mentioned above.

To accomplish the above object, according to a preferred embodiment of the invention, there is provided a coding apparatus comprising: coding means for variable-length coding an input signal on a predetermined unit basis; output means for generating the data which has been variable-length coded on said predetermined unit basis from said coding means; and error correction adding means for adding an error correction code to the coded data generated from said output means.

The above and other objects and advantages of the invention will become apparent from the following detailed description taken in conjunction with the appended claims with reference to the accompanying drawings.

DETAILED DESCRIPTION OF THE PREFERRED EMBODIMENTS

A digital VTR will now be described hereinbelow as an example of a data transmitting apparatus according to the present invention.

Figure 2:
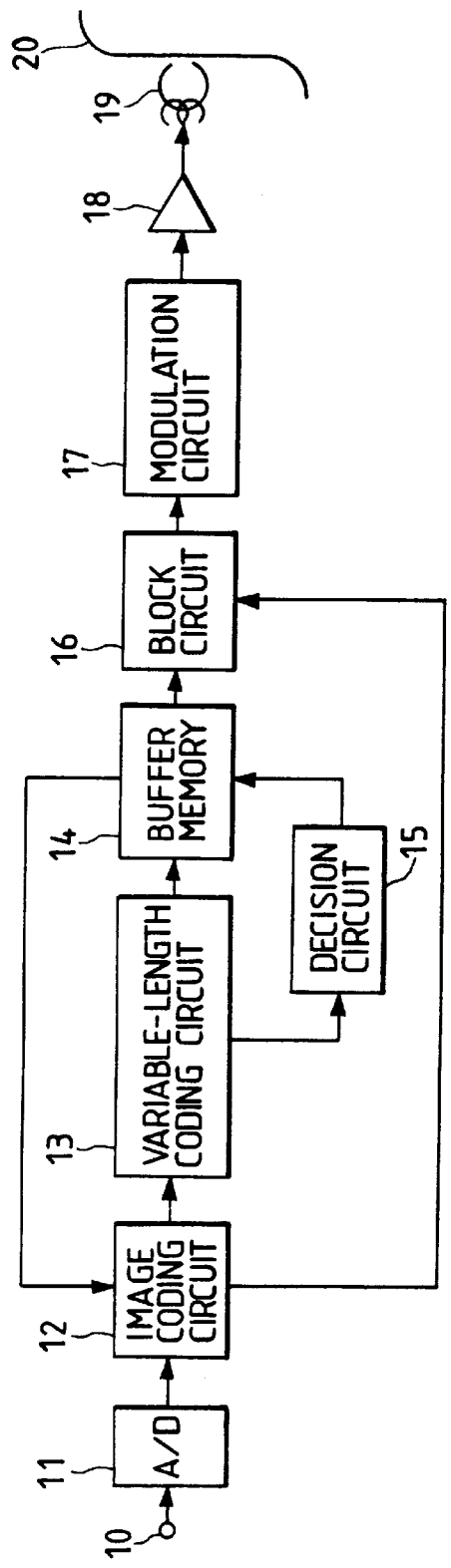
FIG. 2 is a block diagram showing a construction of a recording system of a digital VTR of an embodiment according to the invention.
Figure 3:
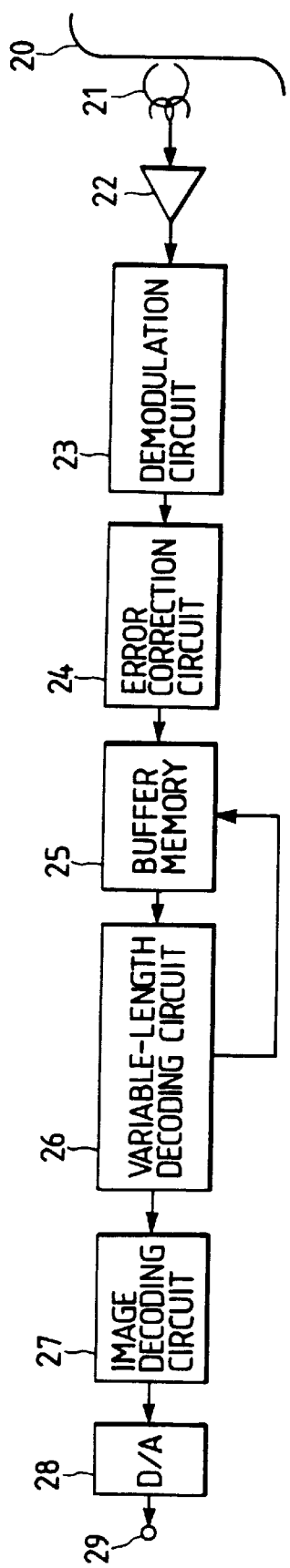
FIG. 3 is a block diagram showing a construction of a reproducing system of the digital VTR of an embodiment according to the invention.

FIG. 2 is a block diagram showing a construction of a recording system of the digital VTR of an embodiment according to the invention. FIG. 3 is a block diagram showing a construction of a reproducing system.

The recording system will be first explained with reference to FIG. 2.

An analog video signal to be recorded is supplied to an input terminal 10 from a video camera or the like.

An A/D converter 11 converts the analog signal from the input terminal 10 into a digital signal.

The digital signal from the A/D converter 11 is sent to an image coding circuit 12 and is compressed and coded by a subsampling and DPCM coding method.

The data processed by the image coding circuit 12 is supplied to a variable length coding circuit 13 and is variable-length coded using a run length code or a Huffman code or the like, thereby further compressing a data amount. On the other hand, ID information, which will be explained hereinlater, is supplied from the image coding circuit 12 to a block circuit 16.

The data which is output from the variable-length coding circuit 13 is transferred to a buffer memory 14. A code length of the output data of the variable-length coding circuit 13 is supplied to a decision circuit 15.

The decision circuit 15 discriminates whether the variable-length coded data from the variable-length coding circuit 13 lies in two error correction blocks, which will be explained hereinbelow, or not. The decision circuit 15 supplies a signal indicative of the result of the discrimination to the buffer memory 14.

Namely, the decision circuit 15 not only detects the resetting position of the variable-length coding but also detects an amount of data which has been variable-length coded up to resetting.

In accordance with the result of the discrimination from the decision circuit 15, the buffer memory 14 adjusts a compression ratio and a reading (output) so that a variable-length code word doesn't lie in two or more error correction blocks.

Figure 1:
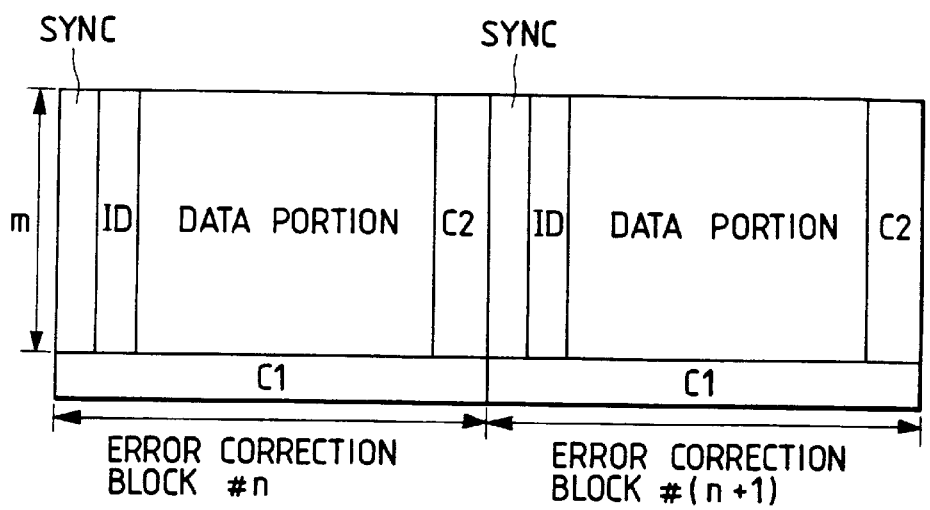
FIG. 1 is a diagram showing a structure of an error correction block.

The block circuit 16 adds a sync code (SYNC), an ID, and parities $C_1$ and $C_2$ of the error correction codes to the output data of the buffer memory 14 every predetermined data amount (i.e., after every so much data) from the buffer memory 14, thereby forming an error correction block as shown in FIG. 1.

Image position information for the variable-length coded data is recorded in ID.

Figure 4A:
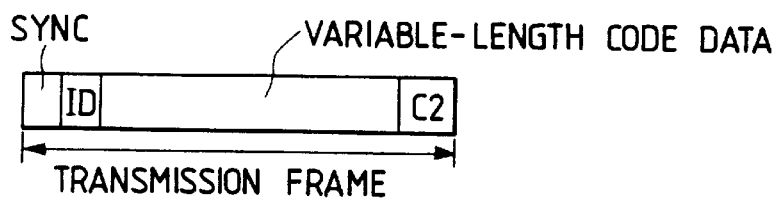
FIGS. 4A and 4B are diagrams for explaining the contents of an error correction block of the embodiment.
Figure 4B:
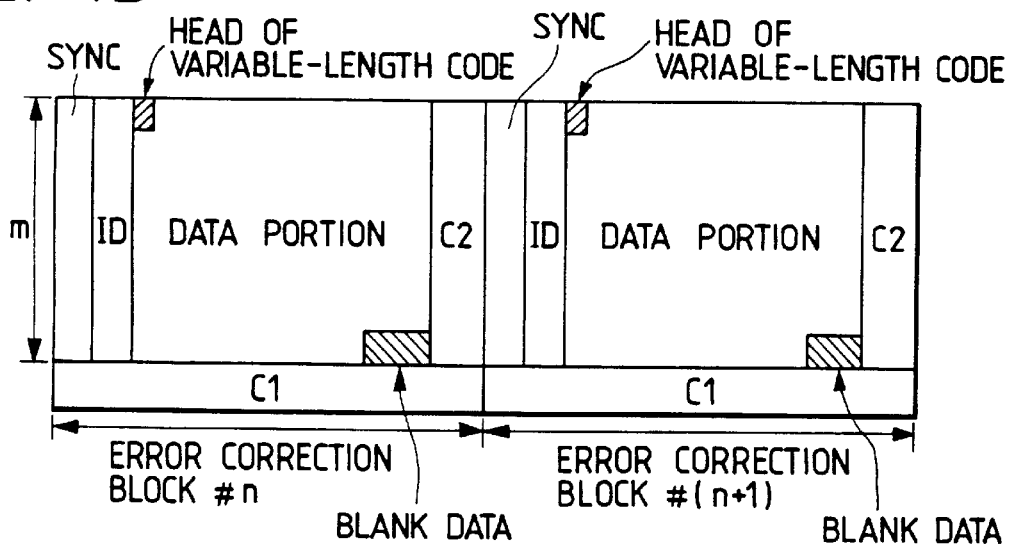

FIGS. 4A and 4B show a detailed structure of an error correction block of the present embodiment. FIG. 4A shows a structure of a transmission frame. FIG. 4B shows a structure of the error correction block.

As shown in FIG. 4B, the error correction block is formed so that the first variable-length coded image data of one image plane is located just after the first SYNC and ID of the error correction block. The ID includes the information of the image position (address). The error correction block is formed by m transmission frames (refer to FIG. 4A) and the $C_1$ parity corresponding to them.

Namely, in FIGS. 4A and 4B, the variable-length coding is reset on the error correction block unit basis.

Figure 5A:
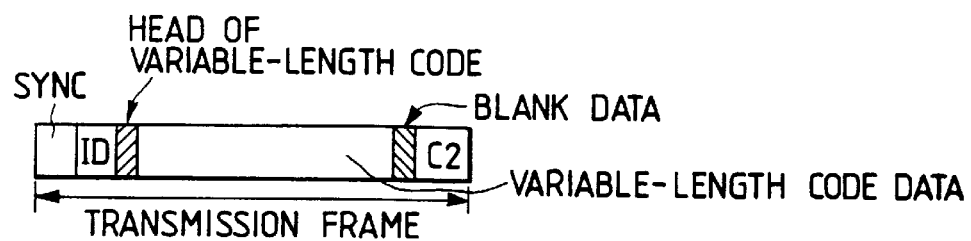
FIGS. 5A and 5B are diagrams for explaining the contents of another error correction block of the embodiment.
Figure 5B:
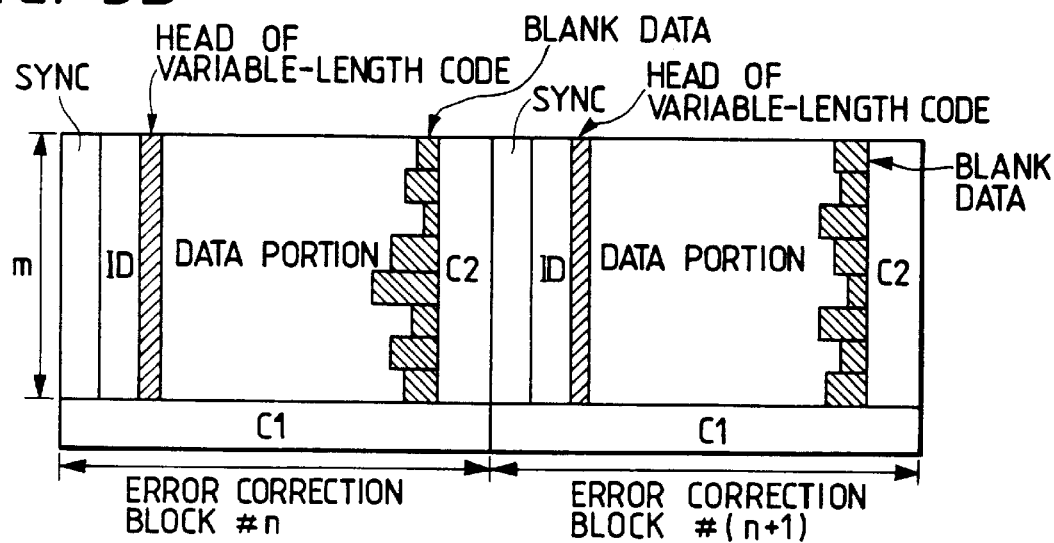

FIGS. 5A and 5B show another embodiment of a structure of the error correction block. FIG. 5A shows a structure of a transmission frame. FIG. 5B shows a structure of an error correction block.

As shown in FIG. 5B, it is also possible to construct in a manner such that the head of the variable-length coded image data is located just after the SYNC and ID of each transmission frame. The error correction block is formed by m transmission frames and the $C_1$ parity corresponding to them.

That is, in FIGS. 5A and 5B, the variable-length coding is reset on the transmission frame unit basis.

In any one of the cases of FIGS. 4A and 4B and FIGS. 5A and 5B, blank data or dummy data is inserted into remaining areas (blank areas shown as hatched portions) which are produced in the case where the variable-length coded data has been stored into the data portion.

Returning to the description of FIG. 2, the information regarding the data amount which is supplied to the block circuit 16 is returned to the image coding circuit 12 from the buffer memory 14.

The image coding circuit 12 adjusts the compression ratio in a manner such that the coded data is stored into one error correction block (in the case of FIGS. 4A and 4B) or one transmission frame (in the case of FIGS. 5A and 5B) and that an amount of the coded data is equal to or larger than a predetermined data amount.

Due to this, it is possible to prevent the number of blank data or dummy data increasing in one error correction block or one transmission frame than it is needed.

A modulating circuit 17 modulates the output data of the block circuit 16. An output of the modulating circuit 17 is amplified by a recording amplifier 18 and is recorded onto a magnetic tape 20 by a magnetic head 19.

The reproducing system will now be described with reference to FIG. 3.

The magnetic recording signal recorded on the magnetic tape 20 is electromagnetically converted by a magnetic head 21 and is amplified by a reproducing amplifier 22 and is applied to a demodulating circuit 23.

The demodulating circuit 23 generates a digital signal of an error correction block structure.

An error correction circuit 24 detects and corrects errors in the data portion of the error correction block shown in FIGS. 4A and 4B or FIGS. 5A and 5B by the parities $C_1$ and $C_2$.

The reproduction data after completion of the error detecting correcting processes is supplied to a variable-length decoding circuit 26 through a buffer memory 25.

The variable-length decoding circuit 26 decodes the variable-length code and supplies it to an image decoding circuit 27, and returns the information as to the length of the variable-length code which has been variable-length decoded to the buffer memory 25.

The buffer memory 25 abandons the data portion corresponding to the variable-length code which was decoded by the variable-length decoding circuit 26 and supplies the data subsequent to such data portion to the variable-length decoding circuit 26.

In the buffer memory 25, the blank data or dummy data is obviously abandoned or ignored.

The image decoding circuit 27 executes the decoding process corresponding to the coding process in the image coding circuit 12 and generates a digital image signal. A D/A converter 28 converts the output signal from the image decoding circuit 27 into an analog signal and supplies from an output terminal 29 to a video monitor or the like.

As will be easily understood from the above description, according to the present embodiment, the propagation of the errors due to the variable-length coding can be minimized into one transmission frame or one error correction block.

Thus, a high compression ratio of the variable-length code can be effectively used.

The present invention can be embodied in other various forms without departing from the spirit and main features of the invention.

For example, although the above embodiment has been described with respect to the digital VTR as an example, the invention can be also applied to transmitting data through a communication line such as an ISDN or the like.

That is, the transmitting apparatus in the present specification incorporates a recording and reproducing apparatus for recording or reproducing information onto/from a recording medium such as magnetic tape, magnetic disc, optical disc, magnetooptic disc, or the like.

In other words, the foregoing description of the embodiment has been given for illustrative purposes only and not to be construed as imposing any limitation in every respect.

The scope of the invention is, therefore, to be determined solely by the following claims and not limited by the text of the specifications and alterations made within a scope equivalent to the scope of the claims falling within the true spirit and scope of the invention.

What is claimed is:

1. A coding apparatus comprising:
   a) coding means for variable-length coding input data per unit predetermined amount of data to output coded data;
   b) forming means for forming data blocks from the coded data, said forming means forming the data blocks in such a manner that a body of coded data corresponding to the predetermined amount of data is not divided between two data blocks,
      wherein each data block contains a fixed amount of data and said forming means adds dummy data to the coded data in such a manner that the amount of data in said each data block equals the fixed amount of data; and
   c) error correction code adding means for adding an error correction check code to said each data block.

2. An apparatus according to claim 1, further having detecting means for detecting an amount of the coded data which is output from said coding means.

3. An apparatus according to claim 2, further having control means for controlling the coding operation of said coding means in accordance with an output of said detecting means.

4. An apparatus according to claim 1, further comprising recording means for recording, on a recording medium, the data block to which the error correction check code is added, utilizing said error correction code adding means.

5. An apparatus according to claim 4, further comprising reproducing means for reproducing the coded data included in the data block recorded on the recording medium.

6. A data transmitting apparatus comprising:
   a) coding means for variable-length coding an input signal on a predetermined unit basis; and
   b) forming means for forming error correction blocks by adding an error correction check code to coded data by said coding means, said forming means forming the error correction blocks in such a manner that a body of coded data corresponding to the predetermined unit is not divided between two error correction blocks,
   wherein each error correction block has a fixed amount of data and said forming means adds dummy data to the coded area in such a manner that the amount of data in said each error correction block equals the fixed amount of data.

7. An apparatus according to claim 6, wherein said coding means further comprises detecting means for detecting an amount of the coded data that is output from said coding means.

8. An apparatus according to claim 7, wherein said coding means further comprises control means for controlling amount of codes generated by a coding operation of said coding means, in accordance with an output of said detecting means.

9. An apparatus according to claim 6, further having recording means for recording error correction block data, including the data coded by said coding means, the dummy data and the error correction check code.

10. A coding method comprising the steps of:
    variable-length coding input data per unit predetermined amount of data to output coded data;
    forming data blocks from the coded data, in data blocks in such a manner that a body of coded data corresponding to the predetermined amount of data is not divided between two data blocks,
    wherein each data block contains a fixed amount of data and said forming step includes adding dummy data to the coded data in such a manner that the amount of data in said each data block equals the fixed amount of data; and
    adding an error correction check code to said each data block.

11. A data transmitting method comprising the steps of:
    variable-length coding an input signal on a predetermined unit basis; and
    forming error correction blocks by adding an error correction check code to coded data produced in said coding step, in such a manner that a body of coded data corresponding to the predetermined unit is not divided between two error correction blocks,
    wherein each error correction block has a fixed amount of data and said forming step includes adding dummy data to the coded area in such a manner that the amount of data in each error correction block equals that fixed amount of data.

12. A decoding apparatus comprising:
    a) input means for inputting error correction blocks, the error correction blocks including an error correction check code, variable-length coded data and dummy data, wherein the variable-length coded data is data obtained by encoding an input signal on a predetermined unit basis and a body of coded data corresponding to the predetermined unit is not divided between two error correction blocks, and wherein each error correction block has a fixed amount of data and the dummy data is added to the coded area of the error correction block in such a manner that the amount of data in said each error correction block equals the fixed amount of data; and
    b) decoding means for decoding the variable-length coded data.

13. An apparatus according to claim 12, wherein said input means includes reproducing means for reproducing the error correction block recorded on a recording medium.

14. A decoding method comprising the steps of:
    a) inputting error correction blocks, the error correction blocks including an error correction check code, variable-length coded data and dummy data, wherein the variable-length coded data is data obtained by encoding an input signal on a predetermined unit basis and a body of coded data corresponding to the predetermined unit is not divided between two error correction blocks, and wherein each error correction block has a fixed amount of data and the dummy data is added to the coded area of the error correction block in such a manner that the amount of data in said each error correction block equals the fixed amount of data; and
    b) decoding the variable-length coded data.

* * * * *